US010453800B1

(12) United States Patent
Piper

(10) Patent No.: US 10,453,800 B1
(45) Date of Patent: Oct. 22, 2019

(54) OPTICAL CHIP ID DEFINITION USING NANOIMPRINT LITHOGRAPHY

(71) Applicant: International Business Machines Corporation, Armonk, NY (US)

(72) Inventor: Daniel Piper, Vancouver, WA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/940,447

(22) Filed: Mar. 29, 2018

(51) Int. Cl.
*H01L 23/544* (2006.01)
*H01L 23/29* (2006.01)
*H01L 21/56* (2006.01)

(52) U.S. Cl.
CPC ............ *H01L 23/544* (2013.01); *H01L 21/56* (2013.01); *H01L 23/293* (2013.01); *H01L 2223/54406* (2013.01); *H01L 2223/54433* (2013.01)

(58) Field of Classification Search
CPC .. G01N 33/487; G01N 33/57; G01N 33/5402; G01N 33/48721; H01L 21/02; H01L 21/66; H01L 23/544; H01L 23/293; H01L 2223/54433; H01L 2223/54406; H01L 23/29
USPC ....................................................... 257/787
See application file for complete search history.

(56) References Cited

U.S. PATENT DOCUMENTS

| | | | |
|---|---|---|---|
| 5,585,662 A | 12/1996 | Ogawa | |
| 6,291,110 B1 | 9/2001 | Cooper et al. | |
| 6,437,454 B1 | 8/2002 | Chiba et al. | |
| 7,170,299 B1 | 1/2007 | Anand et al. | |
| 7,700,381 B2 | 4/2010 | Arikado et al. | |
| 7,842,561 B2 | 11/2010 | Kato | |
| 2006/0136751 A1 | 6/2006 | Bonaccio et al. | |
| 2006/0230959 A1* | 10/2006 | Meijer | B82Y 10/00 101/368 |
| 2008/0131623 A1* | 6/2008 | Zhang | B82Y 10/00 427/569 |
| 2010/0044858 A1 | 2/2010 | Cohn et al. | |
| 2010/0255139 A1* | 10/2010 | Washiya | B29C 43/021 425/405.1 |

(Continued)

FOREIGN PATENT DOCUMENTS

| | | |
|---|---|---|
| JP | 4719131 B2 | 4/2011 |
| JP | 5324808 B2 | 7/2013 |
| JP | 5395931 B2 | 10/2013 |

OTHER PUBLICATIONS

"Thermoset Polyimers: Polyimide", printed on Mar. 22, 2018, 2 pages, http://www.thomasnet.com/articles/plastics-rubber/thermoset-polyimide.

(Continued)

Primary Examiner — Alexander O Williams
(74) Attorney, Agent, or Firm — Scully, Scott, Murphy & Presser, P.C.; Alvin Borromeo, Esq.

(57) ABSTRACT

An optically readable chip ID is provided to an imprintable material that is formed as a last level of an integrated circuit (IC) chip using nanoimprint lithography. The nanoimprint lithography process provides an array of indentations into the imprintable material that is typically arranged in a hexadecimal pattern. The hexadecimal pattern includes one or more optically readable characters which combine to encode chip location identification data. The chip location identification data identifies a unique location of the product chip on a wafer prior to dicing.

11 Claims, 7 Drawing Sheets

(56) References Cited

U.S. PATENT DOCUMENTS

2015/0239172 A1* 8/2015 Dow .................... B29C 33/424
                                                    264/2.7
2016/0038418 A1* 2/2016 DeSimone ........... A61K 9/1641
                                                    424/1.11
2017/0125119 A1   5/2017 Loh et al.
2018/0095067 A1* 4/2018 Huff ................ G01N 33/54326

OTHER PUBLICATIONS

"Maskless Direct Laser Write Lithography System", printed on Mar. 22, 2018, 2 pages, http://www.oainet.com/pdf/oai_dilaise250V4.pdf.

Siqing, S., et al., "Morphology of nanoimprinted polyimide films fabricated via a controlled thermal history", Polymer Journal, published online Apr. 18, 2012, pp. 1036-1041, 44, http://www.nature.com/pj/journal/v44/n10/full/pj201253a.html.

* cited by examiner

| Lotid | Waferid | ChipX | ChipY | HexCoded |
|---|---|---|---|---|
| ... | ... | ... | ... | ... |
| 16254SC2001.000 | 65003QJ6SEA1 | 6 | 5 | 1B4 |
| 16254SC2001.000 | 65003QJ6SEA1 | 6 | 6 | 1B5 |
| 16254SC2001.000 | 65003QJ6SEA1 | 6 | 7 | 1B6 |
| 16254SC2001.000 | 65003QJ6SEA1 | 6 | 8 | 1B7 |
| ... | ... | ... | ... | ... |

800

US 10,453,800 B1

OPTICAL CHIP ID DEFINITION USING NANOIMPRINT LITHOGRAPHY

BACKGROUND

The present application generally relates to integrated circuit (IC) chips, and more particularly to a method of writing a unique chip identification (ID) in an optically readable format on a top level of an IC chip.

During semiconductor device fabrication a large number of IC chips are concurrently formed on wafer substrates. IC chips are typically much smaller than a single wafer, and consequently, tens of thousands of chips can be fabricated using a single wafer. The actual number of IC chips yielded from a single wafer is a function of the wafer size and the individual chip size. Wafer manufacturers typically mark bare wafers with a unique code or identifier using, e.g., laser impingement. This identification code, typically located on the wafer edge, is unique to each wafer and can be human-readable, machine-readable, or both.

The wafers are then diced into individual IC chips. Once wafers are diced, the IC chips are picked and assembled into chip packages. At this point, it is not easy to determine exactly where on a wafer a particular IC chip originated. Determining the original wafer location of an IC chip is known as chip location identification. There are several reasons why it is desirable to have chip location identification traceability. For example, such information is useful for process learning so that defects can be corrected, product dispositioning for known defects, qualification learning, and engineering evaluation support (e.g., 'wafer striping').

SUMMARY

An optically readable chip ID is provided to an imprintable material that is formed as a last level of an integrated circuit (IC) chip using nanoimprint lithography. The nanoimprint lithography process provides an array of indentations into the imprintable material that is typically arranged in a hexadecimal pattern. The hexadecimal pattern includes one or more optically readable characters which combine to encode chip location identification data. The chip location identification data identifies a unique location of the product chip on a wafer prior to dicing.

In one aspect of the present application, a method for providing an optically readable ID on an integrated circuit chip is provided. In one embodiment, the method includes providing an imprintable material as a top level of an integrated circuit chip. Indentations are then formed into the imprintable material to provide the optically readable ID. A curing process follows which provides an imprinted material that has a permanent optically readable ID disposed therein.

In another aspect of the present application, a semiconductor device is provided. In one embodiment, the semiconductor device includes an imprinted material as a last level of an integrated circuit chip, wherein the imprinted material contains an optically readable ID disposed therein.

DETAILED DESCRIPTION

Figure 1:
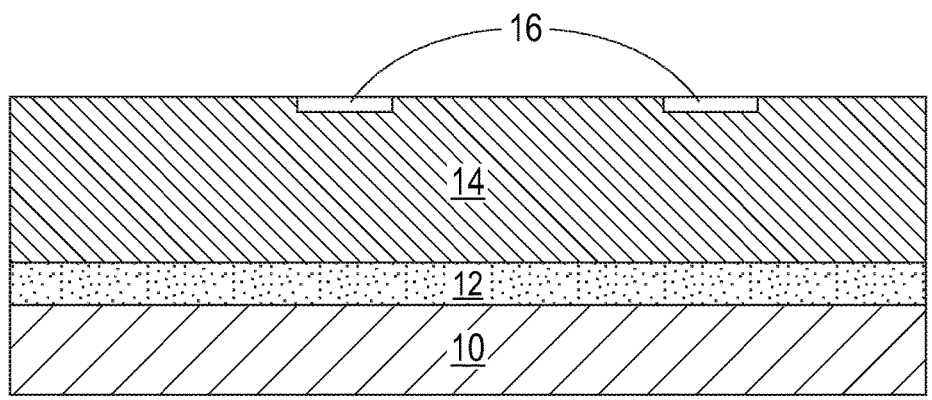
FIG. 1 is a cross sectional view of an integrated circuit chip that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

For example, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present application, as previously noted herein, once a wafer is diced, it is not easy to determine exactly where on the wafer a particular IC chip originated. Chip location identification data ideally includes a unique wafer ID as well as a unique set of chip coordinates (i.e., X and Y coordinates uniquely locating the chip on the wafer surface). Solving chip location identification is an industry challenge having a variety of potential solutions. One conventional approach to provide chip location identification employs laser fuses. This approach, however, requires an additional fuse to be blown to implement and a package tester for read-out. In addition, the use of laser fuses is not qualified for new, low dielectric constant technologies. Another approach involves the use of laser scribing to create a wafer-level chip identification nanoimprint. Laser scribing, however, creates mechanical damage and stress concentrations. Consequently, laser scribing is not qualified for some architectures (i.e., flip chip plastic ball grid array (FC-PBGA)), and cannot be read after packaging since typically the back side of the IC chip is covered.

Other approaches employ electronic-chip identification (i.e., e-fuse ID or ECID). Conventional ECID-based approaches, however, require additional chip design steps, a wafer test to blow fuses, a poly conductor mask (which cannot be used for CPI/packaging test sites) and require a package tester for electrical read-out. Electrical read-out of a chip's ECID post die-sort-pick (DSP) is itself challenging. For example, attempting to employ guardband specification relief for a wafer final test (WFT) that includes previously failing circuit-limited yield (CLY) chips as "good" requires that the die stock failing chips be packaged into mods to read the ECID. The ECID must then be matched to the WFT CLY data to determine if the chip can pass. There is always waste involved with this type of testing due to chip yield (i.e., each batch includes some percentage of chips that will fail).

Turning now to an overview of the present application, an optically readable chip ID is provided to an imprintable material that is formed as a last level of an integrated circuit (IC) chip using nanoimprint lithography. The nanoimprint lithography process provides an array of indentations into the imprintable material that is typically arranged in a hexadecimal pattern. The hexadecimal pattern includes one or more optically readable characters which combine to encode chip location identification data. The chip location identification data identifies a unique location of the product chip on a wafer prior to dicing. Advantageously, an optically readable chip ID prepared using an imprintable material and nanoimprint lithography avoids the waste associated with conventional electrical ECID (e.g., this approach does not require module builds to read), directly saving costs. In other words, the optically readable chip ID that is prepared using the imprintable material and nanoimprint lithography can be optically read post-dicing where the chip's waferID, chipX, and chipY information would be otherwise unknown without requiring mod packages or electrical ECID read-out.

Referring first to FIG. 1, there is illustrated an integrated circuit (IC) chip that can be employed in accordance with an embodiment of the present application. The IC chip includes a semiconductor substrate (or wafer) 10, a semiconductor device level 12 including one or more semiconductor devices disposed therein, and a back-end-of-the-line (BEOL) structure 14 which contains contact pads 16 dispose therein.

The semiconductor substrate (or wafer) 10 may include one or more materials that have semiconducting properties. Materials having semiconducting properties (known to those skilled in the art as a semiconductor material) that can be employed as the semiconductor substrate (or wafer) 10 include, but are not limited to, silicon (Si), germanium (Ge), a silicon germanium alloy (SiGe), silicon germanium carbide (SiGeC), a III-V compound semiconductor or a II-VI compound semiconductor. In one embodiment, the semiconductor substrate 10 may be a bulk semiconductor (i.e., entirely composed of one or more materials having semiconducting properties). In another embodiment, the semiconductor substrate 10 may be a semiconductor-on-insulator (SOI) substrate including, from top to bottom, a semiconductor device layer, an insulator layer and a handle substrate. In one embodiment, the semiconductor material that provides at least an uppermost portion of the semiconductor substrate 10 (bulk or SOI) may be a single crystalline semiconductor material such as, for example, single crystalline silicon.

In some embodiments, the semiconductor material that provides the semiconductor substrate 10 can be lightly doped with an impurity to alter its electrical properties. Specifically, the semiconductor substrate 10 can be doped with an n-type impurity (e.g., phosphorus or arsenic) to render it initially n-type or can be doped with a p-type impurity (e.g., Ga, B, $BF_2$, or Al) to render it initially p-type. The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^3$. Standard round wafer sizes for semiconductor substrate 10 range from a diameter of about 100 mm to a diameter of 300 mm, although other wafer sizes are within the contemplated scope of the present application.

Semiconductor device level 12 includes one or more semiconductor devices (not specifically shown) disposed therein. The semiconductor device level 12 may include an upper portion of the semiconductor substrate 10. The one or more semiconductor devices that can be present in the semiconductor device level 12 include, for example, transistors, capacitors, and/or resistors. The one or more semiconductor devices that can be present in the semiconductor device level 12 can be formed utilizing any conventional front-end-of-the-line (FEOL) process and the one or more semiconductor devices may be composed of well known materials. For example, transistors can be formed utilizing a gate first process or a gate last process and may include a gate dielectric material, and a gate conductor. The semiconductor device level 12 may further include a middle-of-the-line (MOL) dielectric material (such as, for example, silicon dioxide) that surrounds the one or more semiconductor devices. The MOL dielectric material may include one or more electrically conductive contact structures (such, as, for example, a copper, cobalt or tungsten contract structure) embedded therein.

The BEOL structure 14 includes one or more interconnect levels that contain one or more interconnect dielectric materials that embed one or more electrically conductive structures (i.e., copper or aluminum structure) therein. The one or more electrically conductive structure can be formed utilizing a single damascene or a dual damascene process. The BEOL structure 14 also includes bond pads 16 disposed therein. The bond pads 16 may be formed in contact with an uppermost electrically conductive structure of the last interconnect level. The bond pads 16 may be formed by deposition of a bond pad material and thereafter patterning the bond pad material via lithography and etching. The bond pads 16 may be formed within a dielectric capping layer (such as, for example, silicon nitride) that is formed above the last interconnect level of the BEOL structure 14.

Figure 2:
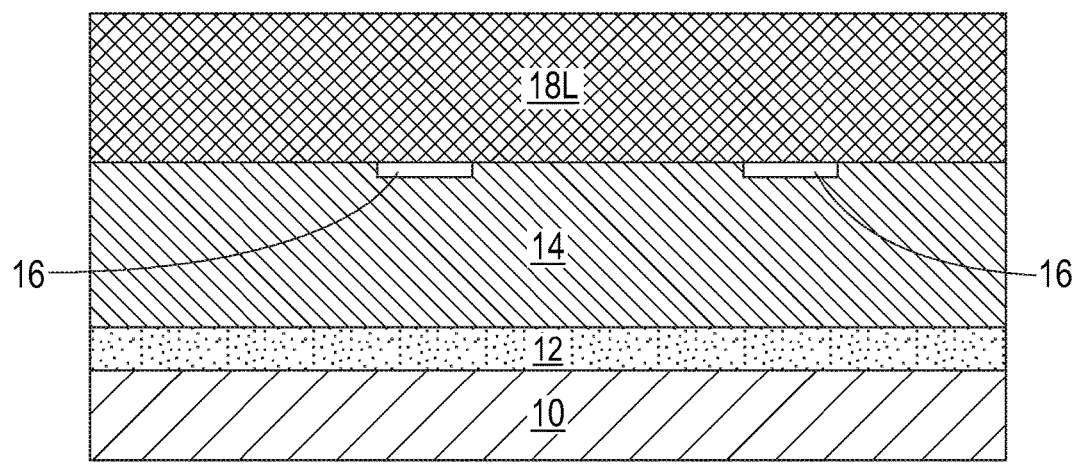
FIG. 2 is a cross sectional view of the integrated circuit chip of FIG. 1 after forming a continuous layer of an imprintable material.

Referring now to FIG. 2, there is illustrated the integrated circuit chip of FIG. 1 after forming a continuous layer of an imprintable material 18L. The term "imprintable material" is used throughout the present application to denote a material in which indentations can be formed therein utilizing nanoimprint lithography as defined in greater detail hereinbelow. The imprintable material that is employed in the present application should also function as a negative photoresist.

The imprintable material that provides the continuous layer of imprintable material 18L is typically a thermosetting polymer. A thermosetting polymer is a polymer that is irreversibly cured from a soft solid or viscous liquid prepolymer or resin. The process of curing changes the resin into an infusible, insoluble polymer network, and is induced by the action of heat or suitable radiation often under high pressure, or by mixing with a catalyst. An example of a thermosetting polymer that can be employed as the imprintable material is a polyimide.

In the present application, the continuous layer of imprintable material 18L represents the last level of the IC chip. The continuous layer of imprintable material 18L may be formed by any deposition process such as, for example, spin-on coating. The continuous layer of an imprintable material 18L typically has a thickness from 5 µm to 100 µm, although other thicknesses for the continuous layer of the imprintable material 18 are within the contemplated scope of the present application.

Figure 3:
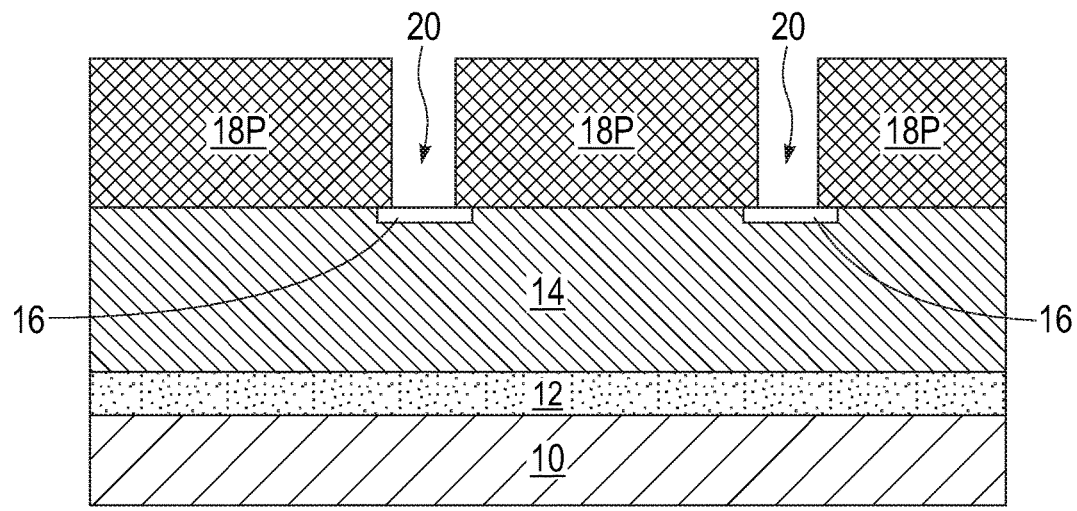
FIG. 3 is a cross sectional view of the integrated circuit chip of FIG. 2 after patterning the continuous layer of imprintable material.

Referring now to FIG. 3, there is illustrated the integrated circuit chip of FIG. 2 after patterning the continuous layer of imprintable material 18. Patterning of the continuous layer of imprintable material 18 may be performed by exposing the imprintable material to a pattern of irradiation and thereafter developing the exposed imprintable material utilizing a developer that removes the exposed portion(s) of the imprintable material. When a polyimide is employed as the imprintable material, the unexposed portions of the polyimide may be removed utilizing developer solution such as CPO (i.e., cyclopentanone) or PGMEA (i.e., propylene glycol monomethyl ether acetate), while the exposed material becomes cross-linked and remains on the substrate post development.

The portion of the continuous layer of imprintable material 18 that remain after patterning may be referred to herein as a patterned imprintable material portion (or just imprintable material portion) 18P. The imprintable material portion 18P is typically located above areas of the IC chip in which the bond pads 16 are not present. The patterning of the continuous layer of imprintable material 18 provides at least one opening 20 within the imprintable material portion 18P. The least one opening 20 is typically located in areas in which a bond pad 16 is present. The at least opening 20 that is formed physically exposes a portion of a topmost surface of the bond pads 16.

Figure 4:
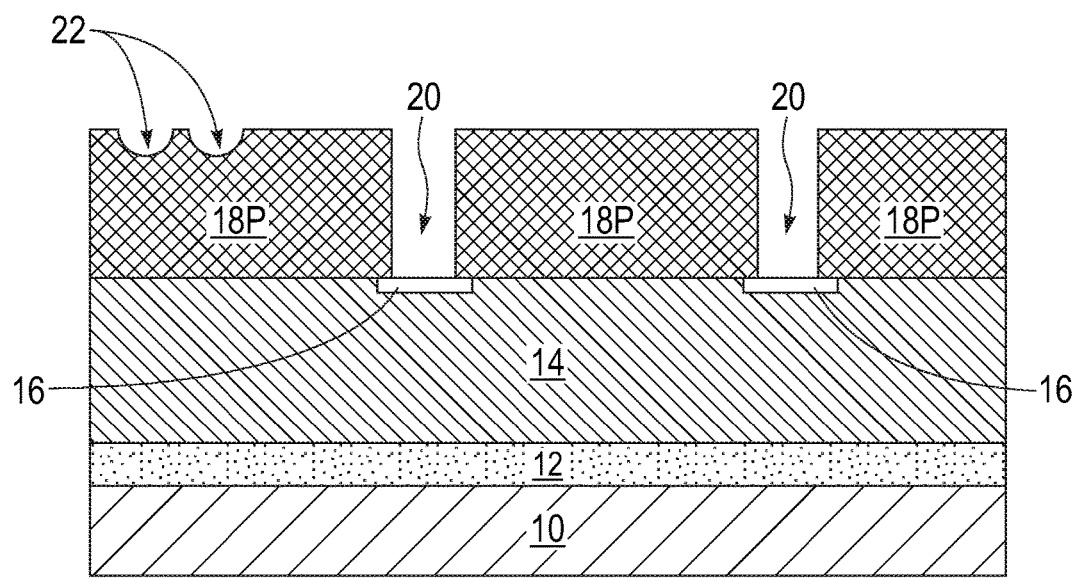
FIG. 4 is a cross sectional view of the integrated circuit chip of FIG. 3 during an early stage of forming indentations into the patterned imprintable material.
Figure 6B:
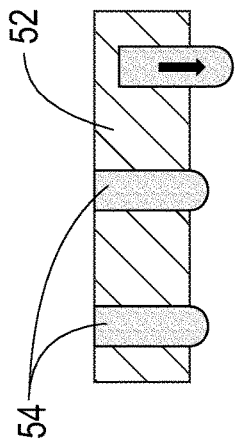
FIG. 6B is a cross sectional view a print head having a plurality of controllable and movable pins that can be employed in the present application.
Figure 6D:
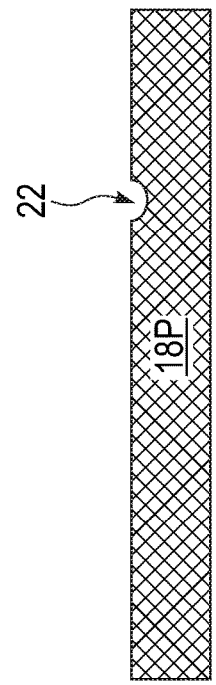
FIG. 6D is a cross sectional view of the imprintable material of FIG. 6C after forming an indentation therein.
Figure 6A:
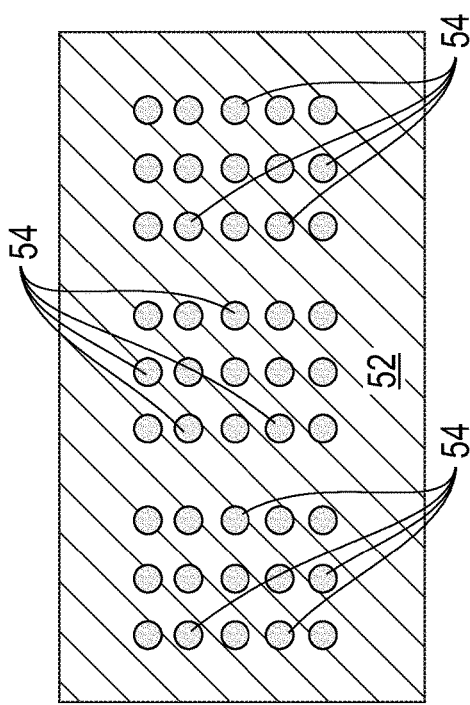
FIG. 6A is a top down view of a print head having a plurality of controllable and movable pins that can be employed in the present application.
Figure 6C:
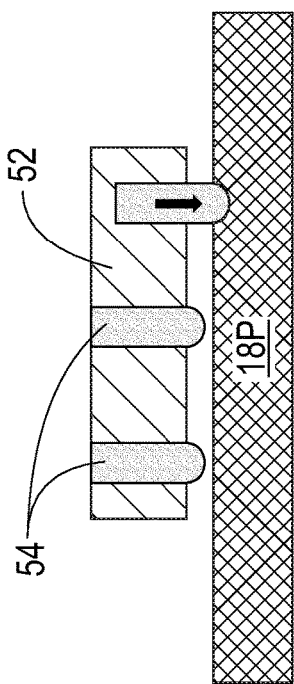
FIG. 6C is a cross sectional view of bringing a print head having a plurality of controllable and movable pins in proximity an imprintable material that is provided as a last level of an integrated circuit chip.

Referring now to FIG. 4, there is shown the integrated circuit chip of FIG. 3 during an early stage of forming an array of indentations 22 in the imprintable material portion 18P. The indentations 22, which are formed partially into the imprintable material portion 18P, are formed utilizing nanoimprint lithography. Nanoimprint lithography includes providing an apparatus that includes a print head 52 having a plurality of controllable and movable pins 54. Such an apparatus is shown in FIGS. 6A-6B of the present application. The pins 54 move in an up and down fashion as illustrated by the arrow that is within one of the pins 54 shown in FIG. 6B of the present application. The movement of the pins 54 can be controlled by an electromechanical mean that is configured to a computer system (not shown). The computer system has a probe hardware loaded therein that would be designed to provide a specific array of indentations 22 into the imprintable material portion 18P. Next, and as shown in FIG. 6C, the print head 52 is brought into proximity to the IC chip containing the imprintable material portion 18P. The distance between the print head 52 and the imprintable material portion 18P should be sufficient to allow the pins 54 to indent the imprintable material portion 18P. Indentations are formed by controlling the movement of the pins 54. FIG. 6D shows the imprintable material portion 18P after forming an indentation 22 by nanoimprintation. Typically, nanoimprintation into a thermoset polymer is achieved by applying a fixed pattern into a malleable surface of the thermoset polymer. Process conditions to achieve desired patterning include time, pressure, temperature and feature dimensions. Such conditions are well known to those skilled in the art and can be selected based upon the type of imprintable material employed. Literature, see, for example, S. Siqing et al. entitled "Morphology of nanoimprinted polyimide films fabricated via a controlled thermal history", Polymer Journal (2012) 44, pp. 1036-1041, the entire content of which is incorporated by reference, has shown sub-micron dimensions are achievable within reasonable time, pressure, temperature conditions.

Figure 5:
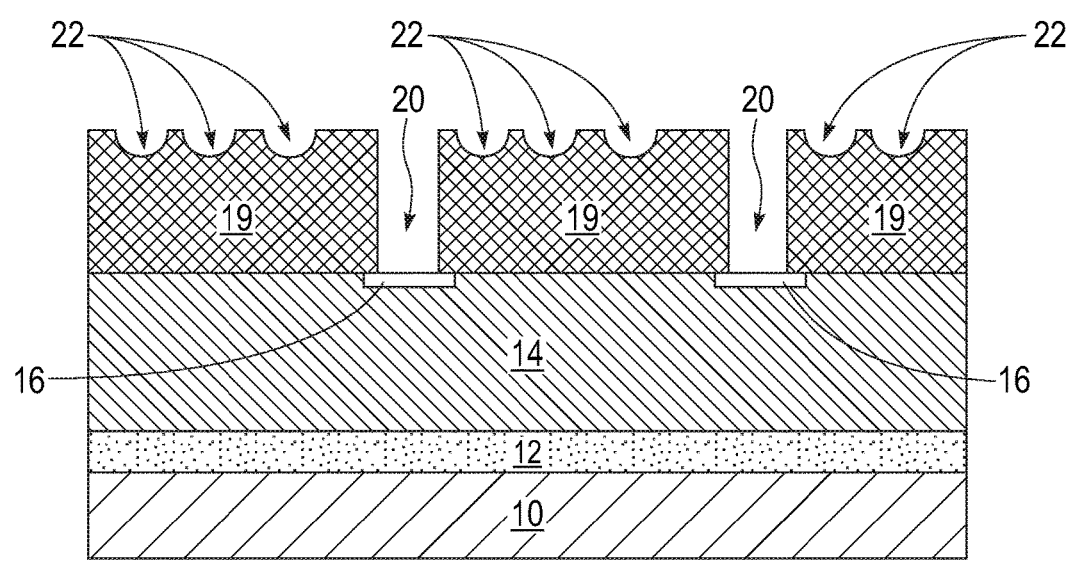
FIG. 5 is a cross sectional view of the integrated circuit chip of FIG. 4 after completing the formations of indentations in the patterned imprintable material and curing the patterned imprintable material containing the indentations to provide an imprinted material that contains a permanent optically readable ID disposed therein.

Referring now to FIG. 5, there is illustrated the integrated circuit chip of FIG. 4 after completing the formations of indentations 22 (by nanoimprintation) in various areas of the imprintable material portion 18P and curing the imprintable material portion 18P containing the indentations 22 to provide an imprinted material portion 19 that contains a permanent optically readable ID disposed therein. Imprinted material portion 19 includes cross-linked polymer chains of the original imprintable material. Curing may performed by heat or UV light. In one embodiment, and when a polyimide is employed as the imprintable material, a curing process follows the imprinting process by heating the polyimide at a temperature above 300° C. Following curing, a signulation process such as, for example, dicing, can be performed.

Figures 7, 8:
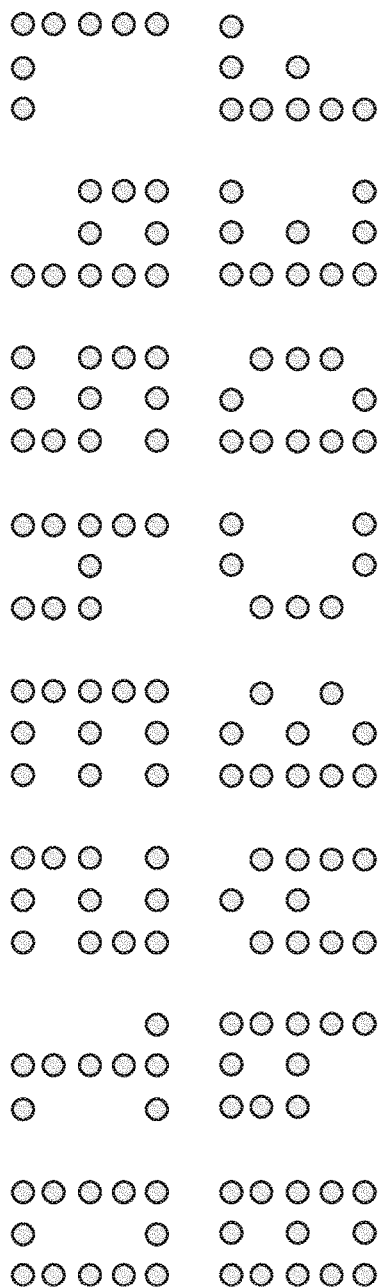
FIG. 7 is a pictorial representation of an optically readable ID that has hexadecimal pattern that can be formed into an imprintable material utilizing the method of the present application.
FIG. 8 is a partial view of a data structure having stored chip location identification data according to an embodiment of the present application.

The indentations 22 that are formed into the imprintable material portion 18P (and thus the resultant permanent optically readable ID) typically have a hexadecimal pattern that that can provide information location identification for the product chip. The hexadecimal pattern (i.e., hexacode) can include any number of digits (i.e., 3, 4, 5, 6, etc) depending on the number of unique identifiers required by a given application. A four digit hexadecimal code provides 65,536 unique identifiers. In some embodiments of the present application, the optically readable ID is instead a base 10 code. In still other embodiments of the present application, the optically readable ID is any other alphanumeric or numeric code (i.e., base 6, letters only, numbers only, binary, etc.). FIG. 7 illustrates an embodiment of the including hexadecimal patterns containing eight identifiers; the top one only contains numbers, while the bottom one contains numbers and alphabetic letters.

The array of indentations 22 that is provided by nanoimprintation process can encode chip location identification data for the product chip. In some embodiments, this chip location identification data includes a unique wafer ID that identifies the parent wafer of the product chip. In some embodiments of the present application, this chip location identification data includes "X" and "Y" wafer coordinates that identify the location on the parent wafer surface where the product chip originated. Forming the array of indentations 22 utilizing the method of the present application advantageously allows for the chip location identification data to be optically read using, for example, conventional automatic testing equipment (ATE) or an inspection microscope. In this manner, chip location identification data can be read without a mod package and without requiring an electrical ECID read.

The array of indentations 22 and thus the optically readable chip ID can be formed in any region of the product chip such as, at a chip corner. In some embodiments of the present application, the array of indentations 22 and thus the optically readable chip ID is located in an electrically inactive central or peripheral region of the product chip (i.e., in a region devoid of device structures).

Figure 11:
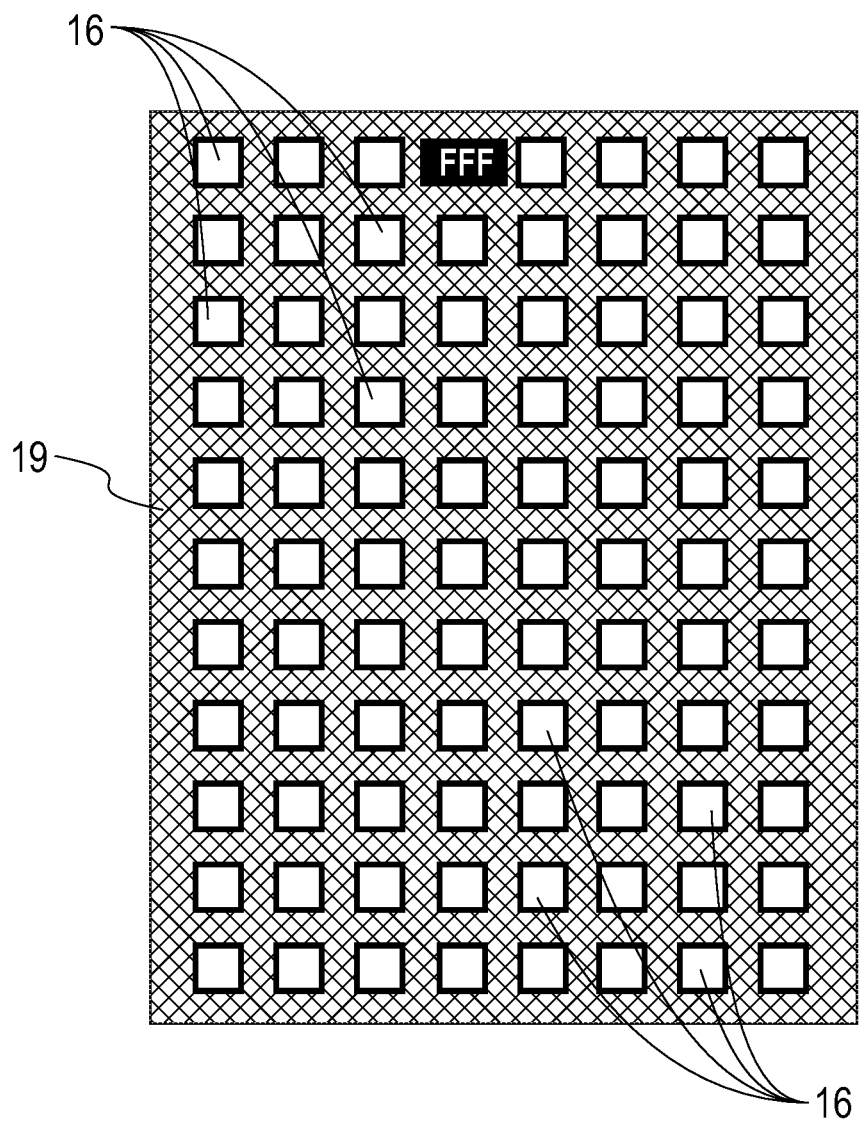
FIG. 11 depicts an IC chip encoded with an optical readable hexcode showing that the size of the hexcode is about the same as that of a bond pad.

FIG. 8 depicts a partial view of a data structure 800 having stored chip location identification data according to one or more embodiments of the present application. As described previously herein, the array of indentations 22 and thus the optically readable chip ID encodes chip location identification data for the product chip. This ID is linked in the data structure 800 to the chip location identification data associated with that particular code. For example, as depicted the hexcode "1B4" encodes Lotid data "16254SC2001.000," Waferid data "65003QJ6SEA1," ChipX data "6," and ChipY data "5." In this manner, the chip location identification data for the product chip can be easily obtained by optically reading the hexadecimal pattern (i.e., hexacode) on the product chip and referring to the data structure 300. A 5×3 character with 2 μm indentations with 1:1 line:space pitch would allow a 5 hex character code to fit within a 80 μm wide×20 μm high form factor, about the size of a bond pad. FIG. 11 illustrates an IC chip (i.e., product chip) 1100 including an imprinted material 19 that contains openings that physically expose a surface of each bond pad 16 in accordance with an embodiment of the present application. The IC chip (i.e., product chip) 1100 also includes a hex character code, FFF, that is about the size of a bond pad 16. Once linked to the chip location identification data, the hexadecimal pattern (i.e., hexacode) can also be used to obtain any other chip-specific data, such as electrical measurements and test sort data. For example, during specification relief for WFT chip-specific electrical data can be retrieved using the hexadecimal pattern (i.e., hexacode) and compared against a modified specification to identify product chips that pass for packaging. While the data structure 800 of FIG. 8 is illustrated as a table, it is understood that the data structure can be any lookup table, array, or any other suitable data structure.

In some embodiments of the present application, chip location identification codes are sequentially assigned from the first chip written to the last chip written in a given lot. For example, the first chip encoded with a hexcode would have the value "000" in the data structure. In some embodiments, the chip location identification codes are sequentially assigned but start at any arbitrary value. In some embodiments of the present application, unique chip location identification codes are randomly assigned. As illustrated in the data structure of FIG. 8, the chip location identification data can include a unique lot identifier, wafer identifier, Chip X identifier, and Chip Y identifier to provide the precise location on a specific wafer of a specific lot where the product chip originated. It is understood that more or less information can be stored in the data structure, depending on the requirements of a given application. For example, lot and/or wafer identification do not need to be stored in the data structure for applications having only a single lot or single wafer. In some embodiments of the present application, the data structure includes additional identifiers, such as, for example, time of fabrication identifiers, fabrication line identifiers, and employee identifiers. In this manner, any information associated with the product chip can be stored in the data structure for easy optical recall.

Figure 9:
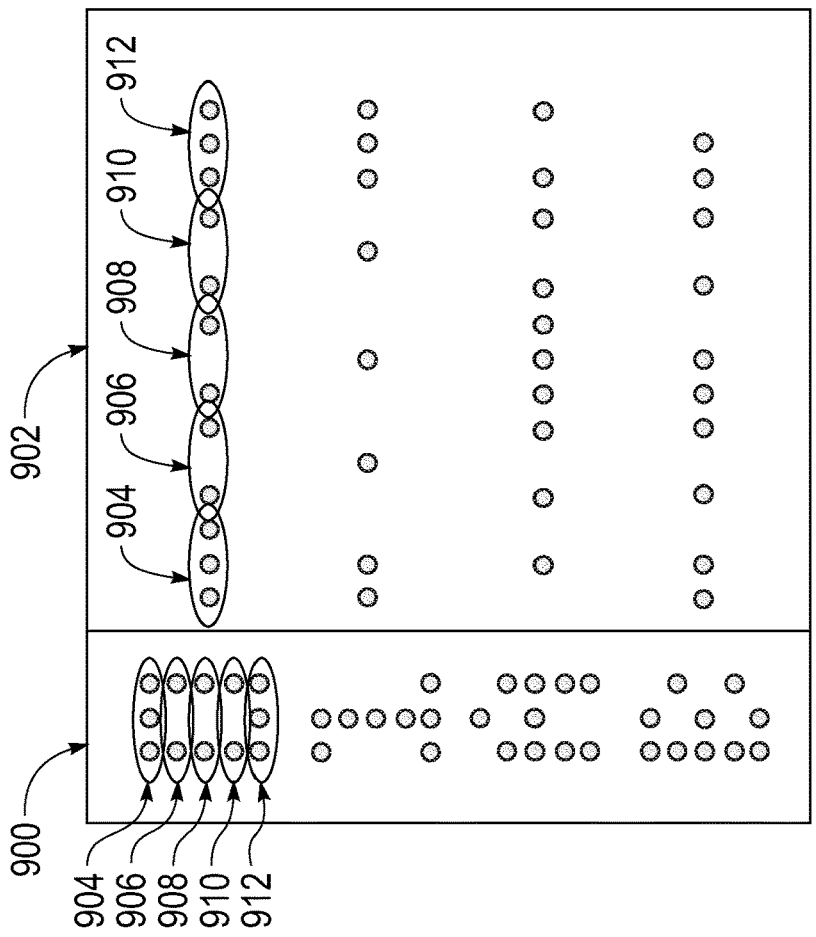
FIG. 9 depicts a system for translating the two-dimensional indentation configuration formed into the imprinted material into a one-dimensional indentation configuration for forming optical readable ID hexcodes according to one embodiment of the present application.

FIG. 9 depicts a system for translating the two-dimensional indentation 900 formed into the imprinted material into a one-dimensional indentation configuration 902. As depicted, the two-dimensional hexcode 900 encodes the hexcode "01AB." Each digit of the two-dimensional hexcode 900 is divided into rows. For example, "0" is divided into rows 904, 906, 908, 910, and 912. The rows 904, 906, 908, 910, and 912 are then unstacked and sequentially arranged to form a portion of the 1-high configuration 902. A 1-high indentation configuration 902 can be advantageous when chip area is limited but the perimeter is available.

Figure 10:
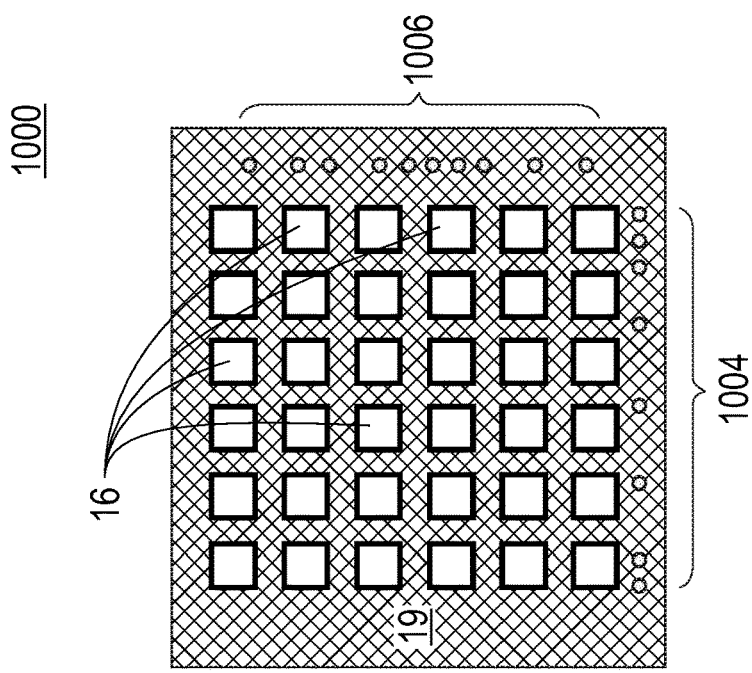
FIG. 10 depicts a product chip encoded with optical readable ID hexcodes in accordance with an embodiment of the present application.

FIG. 10 depicts a product chip 1000 encoded with optical readable ID hexcodes (i.e., 1-high optically readable hexcode) in accordance with an embodiment of the present application. The product chip 1000 includes imprinted material portion 19 having openings that physically expose a surface of an underlying bond pad 16. As depicted, the interior area within the product chip 1000 is limited while the perimeter is relatively free. As discussed previously herein, a 1-high optically readable hexcode is well-suited to chip configurations having a limited interior area when sufficient perimeter space is available. Accordingly, a 1-high optically readable hexcode can be encoded into a ring around the perimeter of the product chip 1000. For example, a first digit 1004 of the 1-high optically readable hexcode encodes the value "1" (as depicted in FIG. 9) while a second digit 1006 of the 1-high optically readable hexcode encodes the value "A" (as depicted in FIG. 9). While depicted as a single ring (i.e., a single perimeter layer), in some embodiments of the present application two or more nested rings of one or more 1-high optically readable hexcodes are formed around the perimeter of the product chip 1000.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method for providing an optically readable ID on an integrated circuit chip, the method comprising:

providing an imprintable material as a top level of the integrated circuit chip; and forming indentations that collectively form a code containing numbers, alphabetic letters or numbers and alphabetic letters into the imprintable material, wherein the code is the optically readable ID.

2. The method of claim 1, wherein the imprintable material comprises a thermoset polymer.

3. The method of claim 2, wherein the thermoset polymer is a polyimide film.

4. The method of claim 1, wherein the forming the indentations comprises nanoimprint lithography.

5. The method of claim 1, wherein the nanoimprint lithography comprises:

providing a print head having a plurality of controllable and movable pins;

bringing the print head into proximity to the imprintable material;

indenting the imprintable material by selecting certain pins of the print head.

6. The method of claim 1, wherein the providing the imprintable material comprises:

depositing a layer of the imprintable material;

exposing the imprintable material to a pattern of irradiation;

developing the pattern into the imprintable material.

7. The method of claim 1, wherein the imprintable material is provided directly above an area of the integrated circuit chip in which bond pads are absent.

8. The method of claim 1, further comprising:

curing the imprintable material containing the optically readable ID to provide an imprinted material containing a permanent optically readable ID.

9. The method of claim 1, wherein the indentations are formed partially into the imprintable material.

10. A method for providing an optically readable ID on an integrated circuit chip, the method comprising:

providing an imprintable material as a top level of the integrated circuit chip; and forming indentations that collectively form a hexadecimal pattern into the imprintable material, wherein the hexadecimal pattern is the optically readable ID.

11. The method of claim 1, further comprising:

optically reading and storing the optically readable ID of the integrated circuit chip.

\* \* \* \* \*